United States Patent

Shah et al.

[11] Patent Number: 5,127,837
[45] Date of Patent: Jul. 7, 1992

[54] ELECTRICAL CONNECTORS AND IC CHIP TESTER EMBODYING SAME

[75] Inventors: Arun J. Shah, Hanover Park; David W. McClung, Bridgeview; Albert N. Hopfer, Park Ridge; Richard J. Linderman, Wood Dale; Saeed Zafar, Park Ridge, all of Ill.

[73] Assignee: Labinal Components and Systems, Inc., Elk Grove Village, Ill.

[21] Appl. No.: 754,261

[22] Filed: Aug. 28, 1991

Related U.S. Application Data

[63] Continuation of Ser. No. 364,343, Jun. 9, 1989, abandoned.

[51] Int. Cl.$^5$ .................. H01R 9/09; H01R 13/62; H05K 1/00
[52] U.S. Cl. .................. 439/71; 439/66; 439/73; 439/75; 439/248; 439/525; 439/331; 439/700
[58] Field of Search .................. 439/54, 71–75, 439/81, 82, 91, 66, 245, 247, 248, 525, 330, 331, 840, 912, 788, 700, 931

[56] References Cited

U.S. PATENT DOCUMENTS

| | | | |
|---|---|---|---|
| 2,153,177 | 4/1939 | Ecker | 175/298 |
| 2,853,656 | 9/1958 | Dowds | 317/101 |
| 3,077,511 | 2/1963 | Bohrer et al. | 174/68.5 |
| 3,200,297 | 8/1965 | Gibson | 317/101 |
| 3,419,844 | 12/1968 | Schmued | 339/43 |
| 3,509,206 | 4/1970 | Harshman et al. | 200/159 |
| 3,513,434 | 5/1970 | Zielke | 339/198 |
| 3,616,532 | 11/1971 | Beck | 29/625 |
| 3,680,037 | 7/1972 | Nellis et al. | 339/61 |
| 3,764,959 | 10/1973 | Toma et al. | 339/177 R |
| 3,795,037 | 3/1974 | Luttmer | 29/628 |
| 3,795,047 | 3/1973 | Abolafia et al. | 29/625 |
| 3,858,958 | 1/1975 | Davies | 339/17 LM |
| 3,862,790 | 1/1975 | Davies et al. | 339/17 LM |
| 3,904,934 | 9/1975 | Martin | 317/101 D |
| 3,971,610 | 7/1976 | Buchoff et al. | 339/17 R |
| 4,029,375 | 6/1977 | Gabrielian | 439/66 |
| 4,082,399 | 4/1978 | Barkhuff | 339/75 |
| 4,236,776 | 12/1980 | Wellington | 439/33 |
| 4,257,661 | 3/1981 | Dalamangas et al. | 339/75 MP |
| 4,360,858 | 11/1982 | Fahling | 361/380 |
| 4,574,331 | 3/1986 | Smolley | 361/393 |
| 4,581,679 | 4/1986 | Smolley | 439/66 |
| 4,593,961 | 6/1986 | Cosmo | 339/61 M |
| 4,620,761 | 11/1986 | Smith et al. | 339/75 MP |
| 4,707,657 | 11/1987 | B egh-Petersen | 439/66 |
| 4,733,172 | 3/1988 | Smolley | 324/158 P |
| 4,882,799 | 5/1976 | Ellicott et al. | 339/252 R |

OTHER PUBLICATIONS

IBM Technical Disclosure Bulletin, vol. 22, No. 1, 1979; pp. 158, 159.

Primary Examiner—Paula A. Bradley
Attorney, Agent, or Firm—Leydig, Voit & Mayer

[57] ABSTRACT

A novel wadded wire-plunger contact is provided which possesses excellent durability and desired functional characteristics in a large variety of applications such as the testing of IC chips.

38 Claims, 3 Drawing Sheets

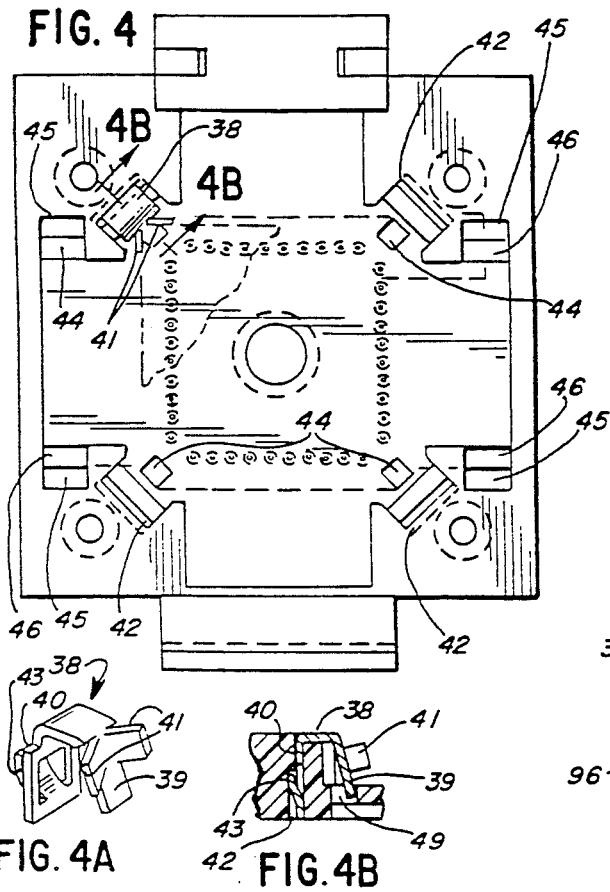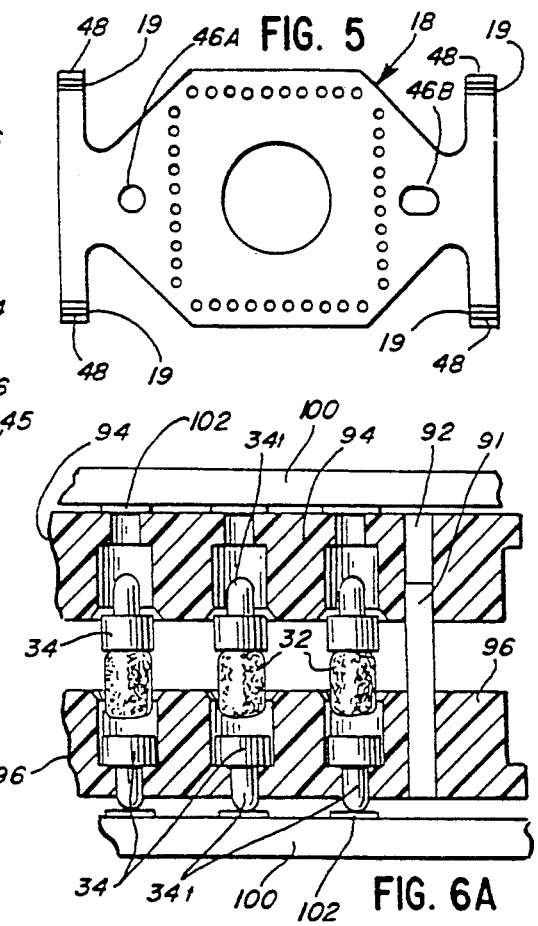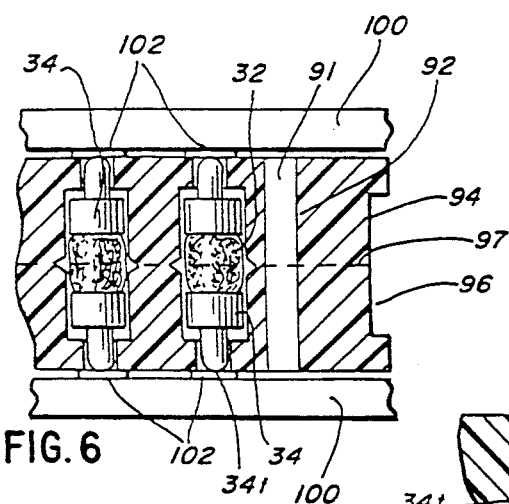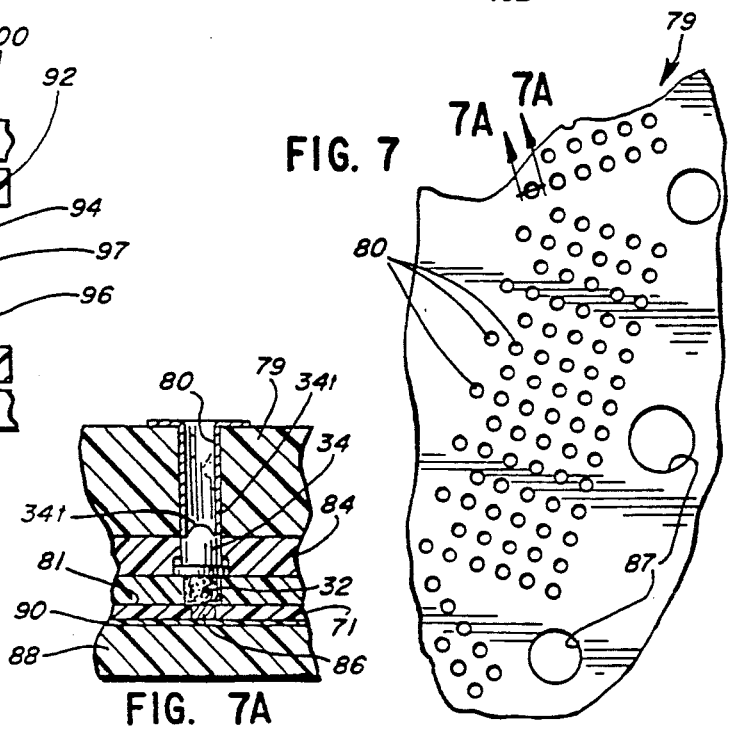

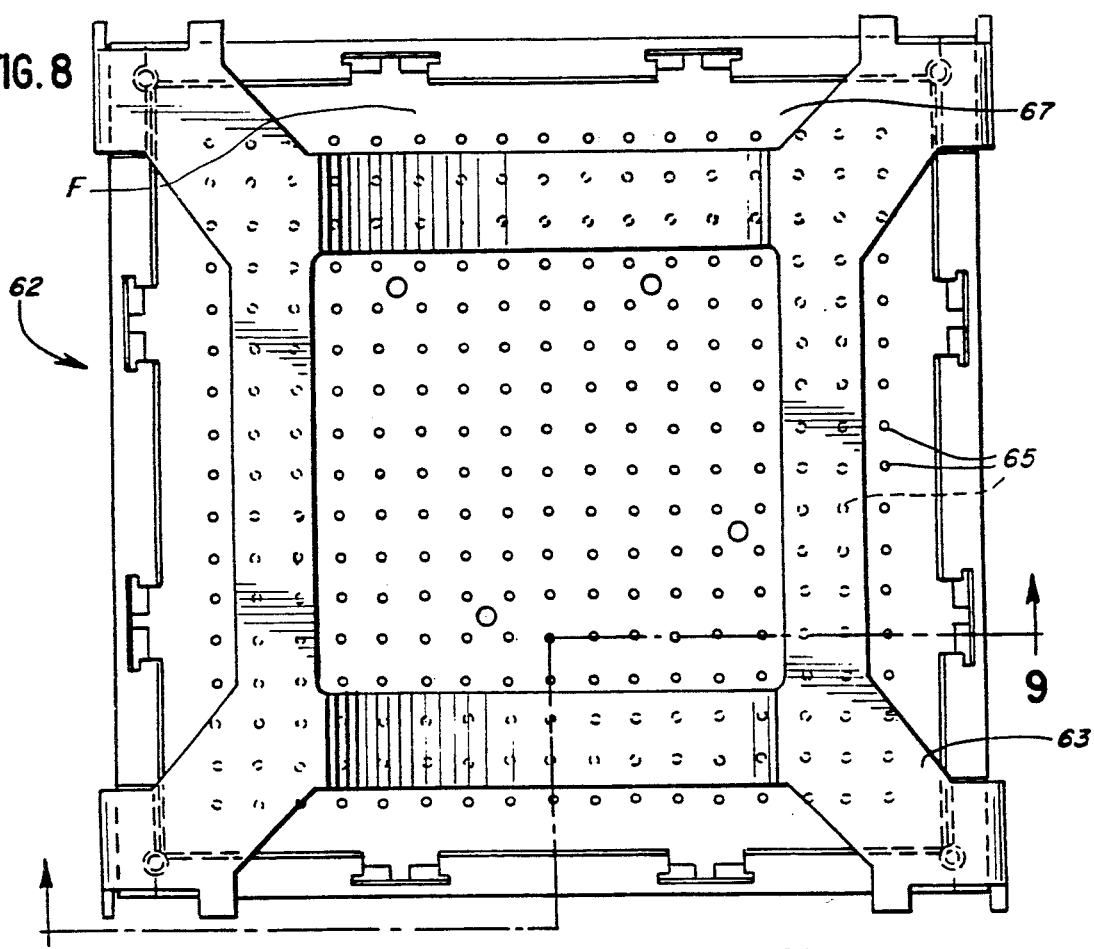
FIG. 8
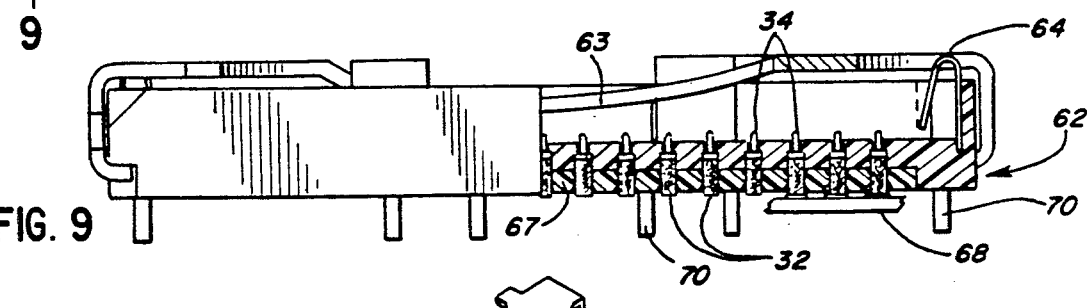
FIG. 9
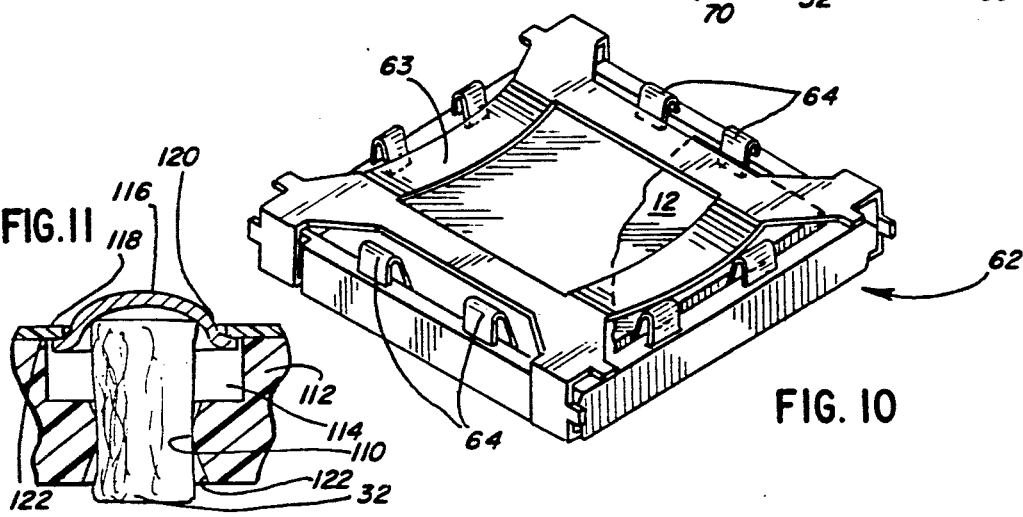
FIG. 11
FIG. 10

ELECTRICAL CONNECTORS AND IC CHIP TESTER EMBODYING SAME

This application is a continuation of application Ser. No. 07/364,343, filed Jun. 9, 1989 now abandoned.

FIELD OF THE INVENTION

This invention relates to improved electrical connectors for electrical components, and more particularly pertains to an improved device for testing integrated-circuit (IC) chips.

BACKGROUND OF THE INVENTION

IC chips are well known in the art and are in a continual state of development. Such chips may contain thousands of microscopic circuit elements and transistors, resistors, etc. Such elements are interconnected within the IC chip in various circuit configurations, and have input/output circuit leads. The chips typically are mounted in chip carriers with these input/output leads connected to conductive areas or pads which may be located about the chip carrier outer periphery or in various patterns across the bottom surface such as on land grid arrays.

The various chip circuits are desirably tested prior to installation in an electronic device to insure proper functioning thereof. Replacement of a faulty chip following installation in a device is both time-consuming and expensive. Accordingly, defective chips must be discovered and discarded if at all possible, prior to installation. Testing is thus seen to be a mandatory preliminary step, particularly as the increasing complexity of IC chips results in a high-percentage failure rate. This testing normally includes circuit testing after the chip is mounted in the chip carrier by contacting the pads on the carrier with suitable test apparatus. Thus the testing and apparatus referred to hereinafter is discussed herein in terms of effecting testing contacts with the chip carrier.

The prior art has employed chip testers using metal or elastomers for conducting signals from a printed circuit trace to an IC chip carrier pad of the chip to be tested. Such elastomers however have a very limited working life and are readily damaged or deteriorate following several test cycles, requiring replacement. Obviously the testing process becomes extremely expensive when thousands of chips are tested daily on a regular basis.

Examples of prior art utilization of such conductive elastomers for use in connectors comprise Buchoff et al. U.S. Pat. No. 3,971,610 of Jul. 27, 1976 and Fahling U.S. Pat. No. 4,360,858 of Nov. 23, 1982.

In accordance with this invention at least one connector comprising a wadded conductive wire button in combination with a conductive plunger is mounted in an apertured insulator board for establishing electrical contact between the pads of a chip and the circuit traces of a PC test board.

The wadded wire adapted to engage the trace of a PC board is resiliently deformable when compressed between the trace and the base of the plunger. The plunger distal end projects from the insulator opening in which disposed for purposes of effecting substantially a point contact with a chip carrier pad by the resilient force of the button.

The use of such wadded wire conductor buttons per se in mounting boards for effecting electrical connections is shown in the prior patent art as in Smolley U.S. Pat. Nos. 4,574,331 of Mar. 4, 1986 and 4,581,679 of Apr. 8, 1986. Also, the use of such wadded wire buttons in testing apparatus is disclosed in Smolley U.S. Pat. No. 4,733,172 of Mar. 22, 1988 in which opposed ends of the disclosed buttons are seen to engage a chip pad and a contact area of a test circuit board.

It has been found however that in the course of relative movement between an end portion of a wadded contact button protruding from a carrier board and a trace of a PC board in the course of effecting repeated desired button-pad location and contact, the wire of the button tends to unravel and cause shorting with an adjacent circuit. Such unraveling also results in non-uniform button-conductor contacts and resultant conductivity inconsistency. Thus it has been found that engagement with loose wire ends of a button contact with an engaging conductive surface will result in undesired increased resistance to current passage.

It is an object of this invention therefore to provide a chip tester employing a wadded wire contact able to effect in excess of 25,000 testing cycles without the need for contact replacement. This is made possible by utilizing in conjunction with such button contacts a plunger having an enlarged base. The plunger engages an associated button disposed within a carrier board at its inner end, and engages a pad of a chip carrier by means of the rounded end of a needle-like projection extending exteriorly of a carrier board in which the plunger is mounted. The latter pad plunger contact effects negligible wear on the plunger and the resiliency of the wire button contact assures desired long extended life of the button-plunger contact combination. The button-engaging plunger may assume other configurations for effecting a low resistance contact as for instance a rounded dome-like projecting portion.

In the various button plunger arrangements care must be taken to design the button-receiving aperture of the button board or carrier so as to allow the button to freely compress and expand in the normal course of urging the plunger contact portion into engagement with a conductive pad or the like. Impairment of the spring action of the wadded wire buttons would adversely affect the positioning of the button ends causing variances in the compressive engagement of the button with resultant unpredictability of the resistance through the resulting button interface.

It is another object of this invention to provide a chip tester of low inductance particularly adapted for high frequency applications, having been successfully tested at 1.5 gigahertz. This is made possible by the low resistance and low inductive electrical path provided by each of the tester contacts hereinafter disclosed.

It is a further object of this invention to provide a button-plunger contact assembly which is particularly suited for rapid connect-disconnect operation and where high signal propagation is desired.

Thus in accordance with one embodiment of this invention a chip tester is provided comprising superimposed apertured insulator boards. In a first board projecting plungers are mounted for effecting substantially point contact with the pads of carriers of IC chips to be tested. In a second insulator board, wadded wire contact buttons are mounted in the apertures thereof and the opposed ends thereof project from opposed surfaces of the board in which the buttons are mounted. The buttons may thus project into the apertures of the overlying plunger board and resiliently bias the terminal plunger contact ends exteriorly of the first board.

The plunger ends may effect substantially point contacts with the pads of a chip carrier to be tested, and the button end portion projecting from the bottom of the second insulator board may effect desired contact with the trace of a test PC board.

With appropriate assembly techniques or sequences, the provided plunger-button contact portions may be disposed in the apertures of a single board and work to equal advantage.

In a modified plunger-button construction particularly adapted for quick make-and-break of electrical contacts, a wadded wire button contact is disposed in an aperture of an insulator housing and engages contact plungers at opposed button ends. The plungers have pin-like pad-engaging terminal contacts which are resiliently biased by the button contacts to project from the housing apertures in which disposed. The opposed plunger contacts may thus readily effect contacts with the contact pads or traces of PC boards or chips to be interconnected when said pads or traces are urged against the resiliently biased plungers, as will hereinafter be described in greater detail.

In the various button and button board embodiments hereafter described, the buttons are desirably retained in button board openings in such manner as to ensure the necessary button resiliency utilized in the normal course of button operation.

The above invention will become more apparent from the following detailed description when read in light of the accompanying drawings wherein:

FIG. 4 is a plan view of the chip socket employed in the chip tester of FIGS. 1 and 2;

FIG. 4A is a perspective view of a chip-centering clip employed in the corners of the socket of FIG. 4;

FIG. 4B is a sectional view illustrating the manner in which the clip of FIG. 4A is secured in place in the socket of FIG. 4;

FIG. 5 is a plan view of a button carrier board employed in the chip tester of FIGS. 1 and 2;

FIG. 6 is an enlarged sectional view, partly in elevation, illustrating a modified contact and board arrangement employed in effecting contact between spaced printed circuit boards by a double plunger means;

FIG. 6A is a view similar to FIG. 6 in which a double-plunger and button contact arrangement as in FIG. 6 is in the process of being assembled;

FIG. 7 is a fragmentary plan view of the connection between a flex circuit and a probe card employed in the testing of integrated circuit devices;

FIG. 7A is a fragmentary sectional view illustrating a button plunger contact made in accordance with this invention particularly adapted for use in automatic testing of integrated circuits and taken on line 7A—7A of FIG. 7.

FIG. 8 is a plan view of a modified land grid array socket employing plunger button contacts made in accordance with this invention;

FIG. 9 is a sectional view taken on line 9—9 of FIG. 8;

FIG. 10 is a perspective view of the land grid array socket of FIGS. 8 and 9; and FIG. 11 is a sectional view of a modified button plunger construction illustrating a modified plunger in combination with an elongate wadded wire button.

DESCRIPTION OF THE INVENTION

Figure 1:
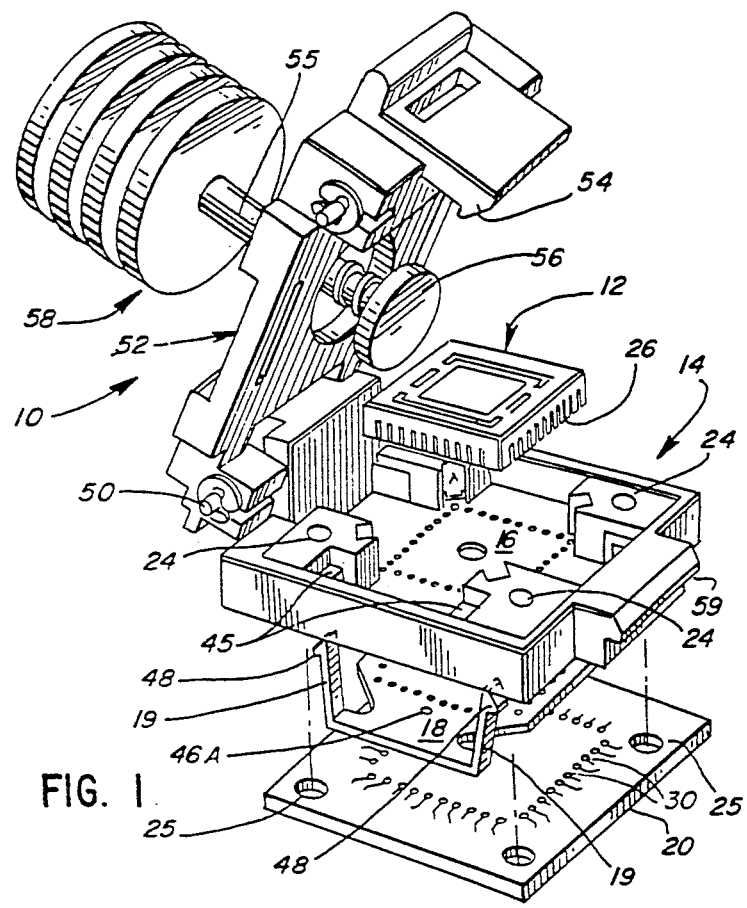
FIG. 1 is an exploded view of an IC tester made in accordance with this invention.

Referring now more particularly to FIG. 1 of the drawing, an exploded view is illustrated of a tester 10 adapted to receive a chip carrier 12 during a chip test cycle. The chip itself is not shown, being concealed within the carrier as noted above. The chip carrier 12 is receivable in socket 14 of the tester 10 on the upper surface of a plunger board 16. A button carrier board 18 having four attaching legs 19 is adapted to effect a snap latching engagement in four corner portions of the socket 14 and simultaneously be resiliently biased against the under surface of the plungers contained in board 16 in the normal course of assembly illustrated in FIG. 3. The button carrier board 18 has a printed circuit test board (PCB) 20 urged against its lower surface by means of assembly cap screw bolts 22 shown in FIG. 2. The bolts 22 traverse four corner openings 24 of the socket 14 seen in FIG. 1, through alignment bosses 15 (FIG. 2), and protrude through openings 25 of the circuit board 20 and are engaged by nuts 22N which abut the underside of the board 20, rendering the test board 20, button carrier board 18 and socket 14 in a rigid compressive state of assembly. The bosses or pins 15 and openings 25 serve as alignment means, to insure proper registry of the respective contact elements 30 and buttons 32.

As above noted, an IC chip may contain thousands of microscopic electrical circuit elements. The output/input leads for the various circuits are connected to conductive pads normally disposed about the periphery of the carrier 12. Thus, in FIGS. 1 and 3, it will be noted that the carrier 12 has a plurality of contact pads 26 which are disposed about the periphery of its bottom surface. Three of such pads being illustrated on an enlarged scale in FIG. 3. As was also above pointed out, in view of the complexity of chips employed today, a high percentage of chips manufactured possess some defect which, if uncovered following installation in an electronic device, would lead to costly and time consuming replacement and repair of such device. Accordingly, it is of great importance that the chips be tested as satisfactory when used in conjunction with circuitry of a test board such as test board 20 illustrated in FIGS. 1-3 so as to function satisfactorily for all purposes in the circuitry of a device in which the chip is to be installed.

Figure 3:
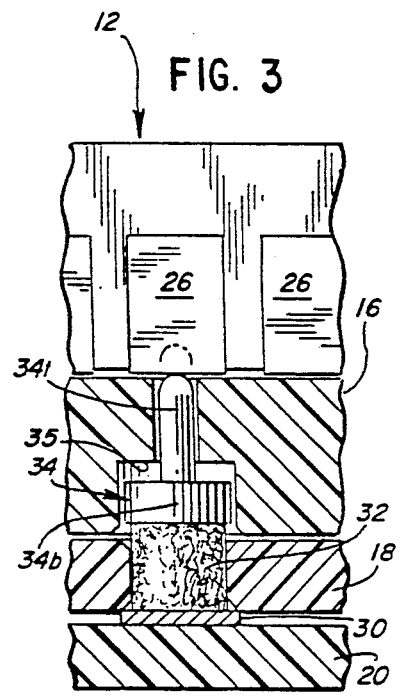
FIG. 3 is an enlarged sectional view illustrating the test path present in the chip tester of FIGS. 1 and 2 in the normal course of operation thereof.

An invention of this application may be readily appreciated from an examination of the sectional view of FIG. 3. The latter illustrates test board 20 having a trace 30 representing circuitry for testing the chip in carrier 12, e.g., representing circuitry in which the chip is normally to be employed. In accordance with this invention, electrical communication is established between the test board circuitry 30 and the pads 26 of carrier 12 by means of interconnecting compressible wire buttons 32 mounted in button board 18 and electrically conductive plungers 34 reciprocally mounted in plunger board 16.

Figure 2:
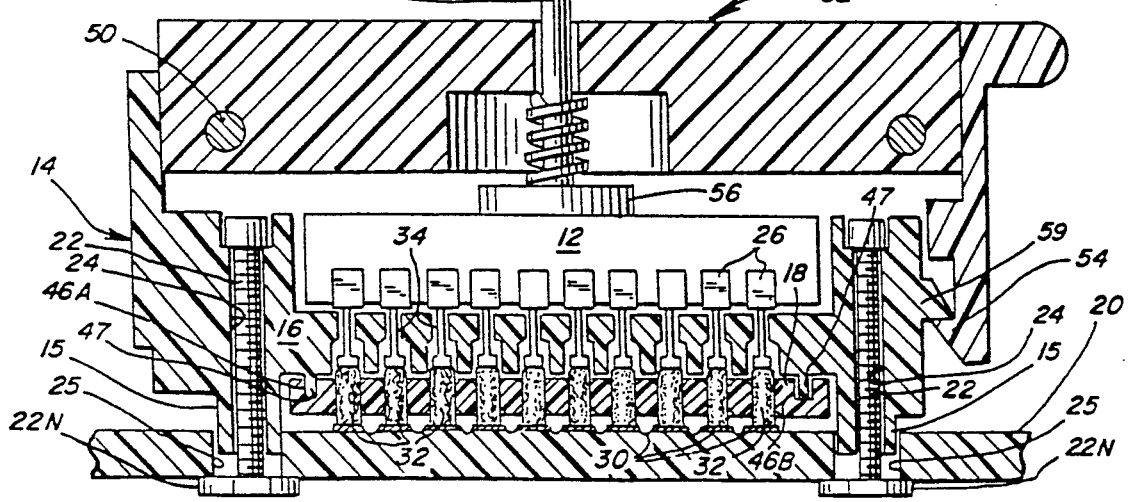
FIG. 2 is a fragmentary sectional view, partly in elevation of the chip tester of FIG. 1 in the normal course of operation and illustrated on a scale enlarged over that of FIG. 1.

In chip testers of the prior art, conductive elastomers are mounted in insulating boards for purposes of effecting electrical communication between a trace or pad on a test printed circuit board and a chip pad. Also, as above noted, use of conductive buttons 32 for purposes of effecting electrical connections is known in the art. Such buttons are preferably formed from a single strand of metal wire with each strand being wadded together to form a nearly cylindrical button. Each wadded wire connector 32 is formed so as to fit within its receiving opening in the button board 18 as illustrated in FIGS. 2 and 3 so as not to be frictionally gripped thereby so as to restrict its ability to function as a resilient spring member. It will be noted from FIGS. 2 and 3 that in those board button combinations in which the buttons 32 project from a board surface, the button-receiving opening on such surface preferably is chamfered or enlarged. Such enlargement not only facilitates entry of a button if inserted from such surface but provides space assuring retention of the buttons within the limits of the board opening despite any button "mushrooming," off-center shifting of the button ends during compression or the presence of loosened strands at the button ends. During button compression and operation of the contacts, the traces or pads preferably abut against the board surfaces as illustrated in the drawings. Also as illustrated in FIG. 3 a carrier board 18 may have a central button-engaging restriction portion R to retain the button along a central restricted annulus while allowing opposed elongate end portions of the buttons to freely compress and expand. Any button board opening design may be employed which allows desired resiliency of the buttons without gripping of the buttons so as to impair this necessary compression and expansion function. As a result, uniform button resilience and contacting is effected with resulting desired uniformity of conductivity.

The openings in the button engaging boards such as boards 18 (and 16) of FIG. 3 may be formed by injection molding of appropriate insulating materials in dies of suitable configurations to provide the openings as the boards are molded. An example of suitable materials is polyphenelene sulfide such as sold by Phillips Petroleum Company under the tradename Ryton. Molding assures smooth aperture peripheries avoiding undesired button snagging or hangup. Fillers may be employed for strength enhancement.

Button receiving openings may also be drilled in appropriate dielectric boards, and the chamfers may be formed by appropriate drilling or reaming of the aperture ends.

Each button 32 is so sized as to protrude slightly above and slightly below the carrier board 18 in which disposed. Each button 32 effects electrical contact at multiple points with pad 30 of test board 20 at its cylindrical base and, at its opposed button end, effects similar electrical contact with the base of the respective plunger contact 34. Wadded wire button contacts such as contacts 32 provide significant operational advantages not present in other types of connections such as soldered connections. The connections provided thereby are of high integrity and reliability and have very few associated variables which may affect the quality of the electrical connection of which comprising a part. The only significant variables in contacts formed by buttons 32 are the size of the button itself and the compressive force which may be applied thereto in the course of effecting the interconnection between the opposed conductors of the connection in which the button comprises an intermediate element.

The buttons 32 are preferably formed from wire fabricated from copper alloys such as beryllium and copper, silver and copper, or copper-nickel-tin. It is apparent that when such buttons are placed under compression, they effect multiple contacts with the opposed contact areas providing multiple conductive paths. The wadded wire buttons are so formed they are substantially resilient so that when subjected to a compressive force, each button has a tendency to return to substantially its original shape. The wadded wire connectors 34 may be of the type marketed by the Cinch Division of Labinal Components and Systems, Inc., of Elk Grove Village, Ill., under the trademark CIN::APSE. Similar suitable buttons are available from other commercial sources.

In the normal course of use of the tester 10, the chip carrier is mounted in the recessed socket 14, the bottom of which comprises of plunger board 16 in which metallic plungers 34 are mounted for reciprocal movement. Each plunger may be formed of a durable electrically conductive metal, which is preferably coated with 200 micro inches of nickel and 100 micro inches of gold to enhance its durability. It is apparent in FIG. 3 that each plunger 34 has an enlarged cylindrical base portion 34b as well as an attached cylindrical bullet-shaped terminal portion 34t of lesser diameter having a rounded end limit to effect substantially a point contact with the engaged pad 26.

It will be noted from FIG. 4 that each corner portion of the socket 14 has mounted therein a clip 38 seen in perspective in FIG. 4A. Each clip 38 has a mounting leg 40 which is received in a recess 42 in the socket whereby it is retained and locked in position therewith either by means of a tang 43 (see FIG. 4B) or by an appropriate adhesive. Tang 43 snaps into interlocking engagement with a mating ledge portion of the socket recess in which it is disposed. A spring finger 39, resiliently joined to the mounting leg 40 by an intervening bight portion, extends angularly inward and downward at the respective corner of the carrier-receiving cavity of the socket 14. These fingers are positioned to resiliently engage the carrier at its corners and center it in proper alignment in the socket cavity. A pair of tabs or wings 41 formed outward on the engagement leg 39 preferably define a right angular receiver to engage the respective corner of the carrier 12. Three of the recesses 42 for reception of the spring clips 38 are seen in the top plan view of FIG. 4 prior to insertion of mounting and centering springs 38; a clip 38 being shown in assembled position in the fourth corner. The outer end of leg 39 is engaged in a slot 44 in the socket for alignment and retention purposes (see FIG. 4B).

The button board or carrier 18 is snap latched into engagement against the under surface of socket 14 by means of its four flexible latching arms 19 having terminal latch portions 48. Referring further to FIG. 4, as well as FIGS. 1 and 2, the socket 14 includes four apertures 46 for receiving the attaching legs 19 of the button board 18 and shoulders 45 for latching engagement by the detent shoulders 48 at the outer ends of those legs. The legs 19 are slightly divergent (see FIG. 1) and resilient to effect snap latching engagement on the shoulders 45. Referring to FIGS. 1, 2 and 5, alignment means are provided by way of an aperture 46A and a slot 46B in board 18 and mating depending pins 47 on the socket to effect proper registry of the button board 18 with the plunger board section 16. These components provide attachment and alignment of the button board, and attendant retention of the plungers 34 in the plunger board section 16, prior to attachment of the testing assembly 10 to the test circuit board 20. The latching arms 19 may be replaced by other securement means to maintain the elements of the tester unit in a desired state of assembly. For example, button board 18 may also be received in a press fit in a mating recess in the bottom of the plunger board 16.

Prior to insertion of chip carrier 12, the plunger board section 16 of socket 14 is already in desired compressive engagement with underlying buttons 32 and button board 18 as well as the test printed circuit board 20 in the assembled relationship illustrated in FIG. 2. As earlier noted, the entire assembly is maintained in a compressive state following threaded engagement of the nuts 22N on the assembly bolts 22, urging the test circuit board 20 upwardly against the bottom of the button board or carrier 18 seen in FIG. 5.

During chip testing the circuit test board 20 and button board 18 are in assembled relationship with the plunger housing 16, with the chip carrier 12 urged into desired centered relationship in the socket 14 by corner springs 38. In such centered position the chip carrier is in supported engagement on top of the plungers 34. Cover 52 is then pivoted downwardly from the position of FIG. 1 of the drawing into the position overlying carrier 12. A spring-loaded plunger 55 has an enlarged base portion 56 comprising a component of a heat sink 58 and biases the chip carrier 12 into desired engagement with the underlying projecting terminal portions 34t of the plungers 34 mounted in housing portion 16 comprising the floor of socket 14. Prior to downward movement of the hinged cover 52 which pivotally moves about pivot axis 50, the upper plunger terminal portions 34t are in the dotted line position illustrated in FIG. 3 as a result of the uncompressed conditions of the wadded wire contacts 34. The uncompressed buttons 32 thus upwardly bias plungers 34 toward a limit portion where the upper surface portions of the base portions 34b strike the upper counterbore surfaces 35 of the plunger recesses in which the plungers 34 are disposed. Downward pivotal movement of the tester cover 52 forces the bottom of the carrier contact pads 26 to downwardly move the plunger contacts 34, simultaneously compressing the underlying button contacts 32 into the condition illustrated in FIG. 3. The latter compressed condition assures a desired low resistance, low inductance, high speed electrical connection between the bottom of each chip pad 26 and its associated trace 30 of the test printed circuit board 20. The cover 42 may have means such as latch 54 which effects a snap-lock engagement with mating latch portion 59 of the socket 14 as clearly illustrated in FIG. 2.

After a chip 12 has been tested, the tester cover 52 may be readily unlatched from the socket 14 and pivotally moved upwardly and into the position of FIG. 1 for removal of the carrier with the tested chip and insertion of a new chip carrier. As the test circuit board 20, button board 18 and socket 14 need not be disturbed for the testing of subsequent chips, a succession of carriers may be readily inserted for testing of the carried chips without disturbing any portion of the assembly of FIG. 3 below the lower surface of the carrier 12.

Figure 3A:
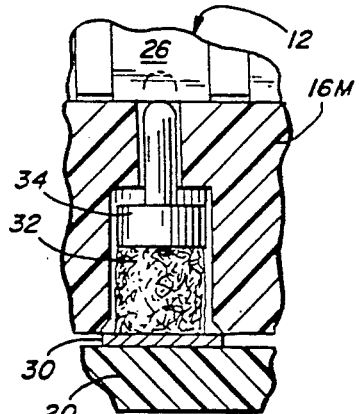
FIG. 3A is an enlarged sectional view similar to FIG. 3 in which the contact button and plunger are mounted in a unitary mounting board, which may be utilized in some circumstances.

The bottom of the socket 14 of the tester 10 may have housed therein not only the plungers 34 but also the buttons 32. FIG. 3A illustrates a unitary board 16M housing both button contacts 32 and plungers 34. This would require that the board 20 be attached, or other means provided, for retention of the buttons and plungers in oversize apertures in board 16M. Similarly, the bottom of the socket 14 may be a thin apertured sheet against which a discrete plunger board and a discrete carrier board and test circuit board may be urged and retained in a condition of assembly by means such as the illustrated assembly bolts 22 or other securing means.

It has been found that if buttons 32 are employed for purposes of effecting direct communication between test circuit board pads 30 and carrier pads 26, the horizontal movement of chip carriers during positioning to the desired location in socket 14 will tend to gradually unravel the upper surface of buttons 32. Such wire unraveling could lead to possible shorting between adjacent pads 26, which in many instances are spaced only a few mils apart, and interfere with the establishing of a desired uniform contact between the pads 26 and the tops of the contact buttons.

In accordance with this invention, by utilization of a two-piece intermediate connector comprising the button 32 and plunger contact 34 between the traces of the test circuit board and the chip contacts, desired uniform electrical communication is established between the board 20 and the chip carrier 12. The only contact effected between each plunger and an engaged pad 26 is in the nature of a point contact under compression. The carrier in the normal course of being located in the recess of the socket 14 of the tester 10 may readily slidably move relative to an engaged plunger terminal contact portion 34t without any damage whatsoever to its engaged, associated button contact 32.

It will be appreciated, for instance, that during the pivotal downward movement of the hinged cover 52 of the tester 10 of FIG. 1, engagement between the base 56 of the spring loaded heat sink 58 and the upper surface of the carrier 12 would normally effect a force component of movement tending to slidably move the carrier 12 away from the pivot axis 50. Such force component has no adverse effect on each contact made between the terminal portion 34t of each plunger contact 34 and each pad 26. However, if the contact were effected directly between a pad 26 and the upper surface of a wadded wire contact 32, such relative slidable movement would have a tendency to unravel the wadded wire upper surface of each contact button 32, leading to the undesired shorting problem and inefficient engagement previously noted.

The arrangement of FIGS. 8 through 10 comprises a working carrier mount and connector assembly in which a grid array in the button board provides for various conductive paths between a variety of board traces and overlying chip pads. FIG. 8 illustrates a chip mounting device in which a chip carrier such as carrier 12 (fragmentarily illustrated in FIG. 10) is adapted to be centered in a socket body 62 having a plurality of centering clips 64 disposed about the periphery of the socket body. Plunger openings 65 are formed in an array in bottom of socket 62 so as to accommodate various pad arrangements of land grid array carriers adapted to be mounted in socket 62. After the carrier is centered in the socket body by means of inverted U-shaped springs 64, an overlying retention spring 63 which is interlocked to peripheral portions of the socket 62 as illustrated in FIG. 10 urges the chip carrier 12 downwardly with a desired, predetermined biasing force against underlying plunger contacts 34 and subjacent wadded wire buttons 32. The distal terminal portions 34t of the plungers 34 are depressed and the buttons 32 compressed following chip insertion into the socket.

The plunger contacts 34 in FIGS. 8 and 9 are arranged in grid array wherein the desired plunger contacts and their associated button contacts 32 may be employed for purposes of effecting desired interconnection between traces of a circuit board 68 and the bottoms of the buttons 32 as illustrated in FIG. 9. It will be noted from FIG. 9 that the buttons 32 may be detachably associated with socket 62 for ready button replacement if and when necessary by a replaceable housing board 67 which may interlock in a bottom recess of the socket 62 by means of a press fit or equivalent means of detachable securement.

The socket button board assembly of FIG. 9 may be readily mounted to a printed circuit board by means of alignment and mounting posts 70. The posts may be received in a friction interference fit in corresponding mounting openings of such circuit boards such as circuit board 68.

The sectional view of FIG. 7A comprises a section taken on line 7A—7A through an opening of an assembly including probe card 79 illustrated in plan view in FIG. 7. FIG. 7A illustrates an assembly wherein wadded wire button contacts 32 and associated plunger contacts 34 of this invention may be employed for purposes of effecting contact in electrical communication with plated through openings such as illustrated openings 80 of probe card 79, the latter being mounted over a plunger board 84 having compressible contact buttons 32 engaging the bottom thereof. The resiliency of buttons 32 mounted in board 81 urges engaged plunger contacts 34 against the end of the plated through openings 80 for purposes of effecting electrical communication between the probe card circuitry and circuitry 86 of a flexible substrate 71. The outer end 34t of the button is generally dome-shaped and of a diameter greater than the diameter of the plated through opening and insures good electrical contact with the hole plating. The bottoms of the button contacts 32 are in engagement with the flex circuit 86 as illustrated. For purposes of maintaining the probe card and flex circuit in desired alignment, aligning pins (not illustrated) traversing openings such as openings 87 of FIG. 7 may be employed. The entire assembly may be mounted above a rigid backing plate such as plate 88 of FIG. 7 on which an insulating layer 90 is disposed to insulate the rigidifying backing plate 88 from the conductor contacts 32 mounted in the button board.

Another application of the novel wadded wire buttons and plunger contacts of this invention is seen in FIGS. 6 and 6A of the drawing wherein it will be noted that opposed plunger boards 94 and 96 may have spaced plungers 34 mounted therein at opposed ends of compressible wadded wire contacts 32. FIG. 6A is an exploded view of this connector arrangement, as in the course of assembly. This double plunger contact assembly may be used to advantage for ready connect-disconnect operations between engaged circuits or traces of spaced printed circuit boards such as printed circuit boards 100 having traces 102. The size of the wadded wire buttons 32 is such relative to the receiving openings in the opposed boards 94 and 96 that desired resilient engagement is made between the plunger contacts 34 as they are urged into compressive engagement with the spaced boards 96 and 94, simultaneously compressing the wadded wire buttons therebetween. Terminal contact portions 34t of the plunger contacts 34 may be urged into compressive engagement with the traces 102, thus effecting good electrical contact between the spaced printed circuit boards. Contact may be readily broken by removing either printed circuit board.

A knurled pin 91 is force-fit in holes 92 of the two boards for alignment and retention purposes. The two discrete boards 94 and 96 also may be joined as by sonic welding or adhesives along juncture line 97 to effectively form a single "board" 95 for permanently capturing the buttons and plungers as in FIG. 6. When the buttons 32 are captured within the board 95 no chamfering of the button openings is necessary to compensate for "mushrooming" exteriorly of the boards. The buttons must be so sized relative to the openings in which the buttons and plungers are disposed so as to assure free button compression and expansion. The board apertures in which the buttons are disposed may of course be of any desired configuration to accommodate desired button expansion.

FIG. 11 demonstrates another variety of plunger configuration which will work to advantage in the novel connectors of this invention. FIG. 11 illustrates a button 32 mounted in an opening 110 extending through a button carrier board 112, with the lower button end exposed for engagement with an appropriate contact component such as a PC board pad or trace. The upper button end portion extends through a large counterbore opening 114 which also accommodates a dome-shaped contact element 116 arranged over the upper end of the button 32. The dome-shaped contact 116 is reciprocally movable within the opening 114. A retainer sheet 118, with an opening 120 therein which is smaller than the outer diameter of the flange portion of the contact 116, is bonded to the top surface of the board 112 and overlaps the flange 110 of the contact 116 to capture the contact and retain it in position on the wadded button 32 for its reciprocal movement. Enlarged portions of the opening 110, including chamfered portion 122 and the counterbore section 114, provide freedom of compressive movement of the respective end portions of the button 32 and the other attendant advantages noted above. Plungers 116 may be readily stamped from a mother sheet and readily assembled in large numbers in the button carrier board 112.

It is thus seen that novel plunger-wadded wire button connector assemblies have been provided in which the full benefits of the wadded wire contacts are obtained in applications such as chip testing and other repetitive circuitry contact situations without destructive consequences to the wadded wire contacts. The provided assemblies isolate an end of a wadded wire button contact from forces tending to disintegrate or unravel such wadded wire button end. As above noted, such unraveling would have a tendency to result in shorting in the course of contacting applications wherein the intervals between the conducting trace or pad surfaces are extremely small. The wadded wire button contacts of the disclosed connectors and testers are extremely durable in compression and are relatively inexpensive to manufacture. Because of the short intervals between the connected circuits of the chip carrier and circuit board, signal distortion occasioned by inductance is substantially eliminated. The point contacts affected by the plunger contacts provide ready relative movement between an engaged pad or trace without any resulting structural damage. As the contacts effected by the plunger contacts are in the nature of point contacts the alignment tolerances of the chip pads or circuit traces or pads relative to the plunger contact is increased.

As above noted, many structural changes and alternative arrangements may be employed without departing from the ambit of the invention disclosed. Accordingly, it is intended that this invention be limited only by the scope of the appended claims.

What is claimed is:

1. An electrical connector particularly adapted for high frequency applications comprising: dielectric housing means having opposed first and second surfaces for assembly with opposed conductors for electrical interconnection; said housing means having at least one prearranged aperture traversing the thickness thereof and extending between aperture openings disposed in said opposed first and second surfaces; a plurality of conductive contact elements disposed in each of said apertures and comprising a wadded conductor first contact element which is resiliently compressible and a second contact element; said wadded conductor resilient contact element having a peripheral portion engaged by a peripheral portion of the housing means defining said aperture; said wadded conductor contact element having a terminal end contact surface exposed through said aperture opening at the first housing means surface; a second contact element in electrical communication with said wadded conductor resilient first contact element and having a terminal end contact portion exposed through said aperture opening at the second housing surface, said second contact element being reciprocably movable in said aperture and biased by said wadded conductor contact element in a direction toward the second housing means surface; the engagement between said wadded conductor resilient contact element and the housing means aperture periphery retaining said wadded conductor resilient contact element in said housing and allowing resilient compression and expansion of the wadded conductor portions connected to the retentively engaged peripheral portion thereof; whereby said wadded conductor resilient contact element resiliently positions said second contact element adjacent said second surface and presents a resiliently supported contact surface adjacent said first surface.

2. The electrical connector of claim 1 in which said second contact element comprises a plunger having an inner base portion engaging said first contact element and connected to a terminal portion which projects through said aperture opening at said second housing surface; said housing means aperture being configured for mating engagement with said plunger whereby reciprocal movement of said plunger in said aperture is axially guided.

3. The electrical connector of claim 1 in combination with a socket for mounting an IC chip carrier for circuit testing and having a plurality of peripherally mounted contact pads; said dielectric housing means being disposed on the bottom of said socket whereby portions of second contact elements mounted in said connector are urged into engagement with contact pads of an IC chip carrier when mounted in said socket; and means for locating a test circuit board having prearranged traces for engagement with terminal end portions of said first resilient contact elements whereby electrical communication is established between said traces and said chip carrier pads.

4. The electrical connector of claim 1 in combination with a probe card mounted over said dielectric housing means second surface and having a plurality of prearranged plated-through openings at which a plurality of prearranged second contact elements of said electrical connector are received in electrical engagement, and a flex circuit disposed adjacent said dielectric housing means first surface and having a plurality of prearranged pads in engagement with terminal ends of certain of said first contact elements.

5. The electrical connector of claim 1 in which said dielectric housing means comprises two superimposed dielectric boards having correspondingly arranged apertures therein; said first contact elements being mounted in apertures of one of said boards; said connector second contract elements being mounted in the apertures of the other of said boards and being resiliently biased by said first contact elements.

6. The electrical connector of claims 1 in which the resilient contact elements are free of excessive frictional engagement with the aperture peripheries in which disposed and function as resilient springs.

7. The invention as in claim 1 wherein said contact surface of said second contact element extends outward from said second surface when said resilient contact element is in its uncompressed state, and said resilient contact element is resiliently compressible to permit forced resilient retraction of the last mentioned contact surface into substantially coplanar relation with said second surface.

8. The invention as in claim 1 wherein said contact surface of said second contact element is of point-like configuration.

9. The electrical contact of claim 1 in which the apertures of the boards in which the first contact elements are disposed are chamfered at the aperture openings from which said first contact elements project; the chamfers preventing mushrooming of the first contact elements exteriorly of the apertures.

10. The electrical connector of claim 1 in which said dielectric housing means comprises discrete dielectric boards; one of said boards having said first contact elements mounted therein and another of said boards mounting said second contact elements therein.

11. The electrical connector of claim 10 in which said dielectric board having said second contact elements mounted therein has latching means attached to peripheral portions thereof for snap engagement with mating portions of said socket.

12. The invention as in claim 1 wherein said contact surface of said first contact element extends outward from said first surface when said resilient contact element is in its uncompressed state, and said resilient contact element is resiliently compressible to permit forced resilient retraction of said last mentioned contact surface into substantially coplanar relation with said first surface.

13. The invention as in claim 12 wherein said contact surface of said second contact element extends outward from said second surface when said resilient contact element is in its uncompressed state, and said resilient contact element is resiliently compressible to permit forced resilient retraction of the last mentioned contact surface into substantially coplanar relation with said second surface.

14. An electrical connector particularly adapted for high frequency applications, comprising: a dielectric housing means having opposed first and second surfaces; at least one prearranged aperture traversing the thickness of said housing means and extending between said first and second surfaces; a plurality of conductive contact elements disposed in each of said apertures; said plurality of contact elements comprising a wadded conductor first contact elements disposed in each of said apertures; said plurality of contact elements comprising a wadded conductor first contact element which is resiliently deformable when compressed and second and third conductive contact elements engaging opposed end portions of said wadded conductor first contact element by means of inner ends and having distal terminal ends exposed through said opposed surfaces of said housing means; said terminal ends being so configured as to effect point-like contact with surfaces disposed at right angles thereto; said second and third contact elements of each plurality being normally outwardly biased by said wadded conductor first contact element whereby the terminal ends of said second and third conductive contact elements are urged outwardly of said housing means aperture thereby.

15. The electrical connector of claims 1 or 14 in which said contact elements define the shortest, most direct conductive path across the thickness of the housing means in which disposed.

16. The invention as in claim 14 wherein said first, second and third contact elements are of appropriate dimensions, relative to the thickness of said housing means, that the terminal ends of said second and third contacts elements normally are spaced apart a distance greater than said thickness when said first contact elements is uncompressed.

17. The invention as in claim 16 wherein said wadded conductor first contact element is sufficiently compressible whereby the second and third conductive contact element terminal ends may be simultaneously urged into coplanar relationship with said housing opposed surfaces by resilient deformation of said first contact element.

18. An electrical connector particularly adapted for high frequency applications comprising: dielectric housing means having opposed first and second surfaces for assembly with opposed conductors for electrical interconnection; said housing means having at least one prearranged aperture traversing the thickness thereof and extending between aperture openings disposed in said opposed first and second surfaces; a plurality of conductive contact elements disposed in each of said apertures and comprising a wadded conductor resilient contact element; said wadded conductor resilient contact element having a peripheral portion engaged by a peripheral portion of the housing means defining said aperture; said wadded conductor contact element having a terminal end contact surface exposed through said aperture opening at the first housing means surface; a second contact element in electrical communication with said wadded conductor resilient contact element and having a terminal end contact portion exposed through said aperture opening at the second housing means surface, said second contact element being reciprocably movable in said aperture and biased by said wadded conductor contact element in a direction toward the second housing means surface; the engagement between said wadded conductor resilient contact element and the housing means aperture periphery retaining said wadded conductor resilient contact element in said housing and allowing resilient compression and expansion of the wadded conductor portions connected to the retentively engaged peripheral portion thereof; whereby said wadded conductor resilient contact element resiliently positions said second contact element adjacent said second surface and presents a resiliently supported contact surface adjacent said first surface; the retentive engagement between said wadded conductor resilient contact elements and the housing periphery being effected by means of a restricted peripheral neck of lesser diameter than the remaining diameter of said housing means aperture.

19. An electrical connector for spaced PC boards comprising a pair of dielectric boards having a plurality of corresponding apertures extending therethrough whereby at least some of said apertures are in alignment when said boards are superimposed on each other; plunger-like contact elements disposed in at least some of the aligned apertures of said boards and having opposed inwardly facing base portions and terminal ends extendable adjacent outer surfaces of each of said boards and adapted to effect abutment-type electrical contact with opposed conductive elements thereat; a wadded conductor contact element, which is resiliently deformable when compressed, disposed in each of said aligned apertures between said opposed base portions of the respective plunger-like contacts therein and engaging the respective opposed plunger base portions when said dielectric boards are urged into adjacent relationship; and said wadded conductor contact elements and plungers in each of said apertures being of such dimensions relative to the board aperture in which disposed that the terminal ends of said plungers are resiliently urged to contact positions adjacent outer surfaces of said dielectric boards when said boards are moved into adjacent relationship with one another, for resilient abutment electrical contact with opposed conductive elements disposed at said contact positions.

20. The electrical connector of claim 10 in combination with spaced PC boards having conductive traces; said traces being in engagement with oppositely projecting terminal plunger ends of said connector; and means for maintaining said PC boards and dielectric boards in desired vertical alignment relative to each other and in a desired state of compression.

21. The invention as in claim 19 wherein said plunger-like contacts and said wadded conductor contact elements are of appropriate dimensions, relative to the thickness of said combined boards, measured parallel to said apertures, when said boards are so disposed adjacent one another, that the terminal ends of said plunger-like contact elements normally are spaced apart a distance greater than said thickness when said first contact element therebetween is uncompressed.

22. The invention as in claim 21 wherein said wadded conductor contact element is sufficiently compressible whereby the terminal ends of said plunger-like contacts may be simultaneously urged into coplanar relationship with said outer surfaces of said dielectric boards by resilient compression of said wadded conductor contact element therebetween.

23. An electrical connector adapted for high frequency applications, comprising: dielectric housing means having opposed first and second surfaces; said housing means having at least one aperture extending therethrough between openings disposed in said opposed first and second surfaces; a plurality of conductive contact elements disposed in each of said apertures and providing a contact surface exposed through each of said openings; said plurality of conductive contact elements in each of said apertures comprising a wadded conductor element which is resiliently compressible within its respective aperture, and two additional contact elements engaging opposed ends of and being in electrical communication with said wadded conductor contact element; said two additional contact elements being reciprocably supported in their respective aperture, resiliently urged by said wadded conductor contact element toward said openings and having contact surfaces exposed through said openings toward which urged, whereby said plurality of conductive contact elements in each of said apertures provides yieldable compressive electrical contact with abutting conductor elements disposed adjacent each of said first and second surfaces at said openings of the respective aperture therein for establishing electrical interconnection between said conductors through said dielectric housing.

24. The invention of claim 19 or 23 wherein said contact elements engaging said wadded conductor contact element and the portions of said housing means defining said apertures adjacent to the respective openings in the respective surfaces of said housing are of complementary configurations for retaining such engaging contact elements in said apertures.

25. An electrical connector particularly adapted for high frequency applications comprising: dielectric housing means having opposed first and second surfaces for assembly with opposed conductors for electrical interconnection; said housing means having at least one prearranged aperture traversing the thickness thereof and extending between aperture openings disposed in said opposed first and second surfaces; a plurality of conductive contact elements disposed in each of said apertures and comprising a wadded conductor resilient first contact element; said wadded conductor resilient contact element having a peripheral portion engaged by a peripheral portion of the housing means defining said aperture; said wadded conductor contact element having a terminal end contact surface exposed through said aperture opening at the first housing means surface; a second contact element in electrical communication with said wadded conductor resilient first contact element and having a terminal end contact portion exposed through said aperture opening at the second housing surface; said second contact element being reciprocably movable in said aperture and biased by said wadded conductor contact element in a direction toward the second housing means surface; the engagement between said wadded conductor resilient contact element and the housing means aperture periphery retaining said wadded conductor resilient contact element in said housing and allowing resilient compression and expansion of the wadded conductor portions connected to the retentively engaged peripheral portion thereof, whereby said wadded conductor resilient contact element resiliently positions said second contact element adjacent said second surface and presents a resiliently supported contact surface adjacent said first surface; a socket for mounting an IC chip carrier for circuit testing and having a plurality of peripherally mounted contact pads; said dielectric housing means being disposed on the bottom of said socket whereby portions of second contact elements mounted in said connector are urged into engagement with contact pads of an IC chip carrier when mounted in said socket; means for locating a test circuit board having prearranged traces for engagement with terminal ends portions of said first resilient contact elements whereby electrical communication is established between said traces and said chip carrier pads; an IC chip carrier mounted in said socket; carrier locating means mounted in corner portions of said socket for desired location of said carrier in said socket, and means for urging said carrier into compressive engagement with said dielectric housing means second surface.

26. The electrical connector of claim 25 in which the carrier urging means comprises a spring loaded heat sink.

27. An electrical connector adapted for high frequency applications, comprising: dielectric housing means having opposed first and second surfaces; said housing means having at least one aperture extending therethrough between openings disposed in said opposed first and second surfaces; a plurality of conductive contact elements disposed in each of said apertures and providing a contact surface exposed through each of said openings; said plurality of conductive contact elements in each of said openings comprising a wadded conductor contact element which is resiliently compressible within said aperture, and at least one additional contact element which is in electrical communication with said wadded conductor contact element, is reciprocably supported in the respective aperture, is resiliently urged by said wadded conductor contact element toward one of said openings and has a contact surface exposed through such one opening; whereby said plurality of conductive contact elements in each of said apertures provides yieldable compressive electrical contact with abutting conductor components disposed adjacent each of said first and second surfaces at said openings of the respective aperture therein for establishing electrical interconnection between such conductors through said dielectric housing.

28. The invention of claim 27 wherein one end of said wadded conductor contact element is exposed at the other of said openings for such abutting electrical contact with a conductor component adjacent the respective surface of said housing.

29. The invention of claim 27 wherein said additional contact element includes a central stem portion and an enlarged abutment portion joined with said stem portion and abutting said resilient wadded conductor contact element, said stem portion extending toward the respective opening.

30. The invention of claim 27, 28, 25 or 29 wherein said additional contact element and the portion of said housing means defining said aperture adjacent the respective opening in the respective surface of said housing are of complementary configurations for retaining said additional contact element in said aperture.

31. An electrical connector adapted for high frequency applications, comprising: dielectric housing means having opposed first and second surfaces; said housing means having an array of apertures extending therethrough between openings disposed in said opposed first and second surfaces; a plurality of conductive contact elements disposed in each of said apertures of said array and providing a contact surface exposed through each of said openings of said array; each of said plurality of conductive contact elements comprising a wadded conductor contact element which is resiliently compressible within its respective aperture; said plurality of contact elements also including at least one additional contact element which is in electrical communication with said wadded conductor element, is reciprocally supported in its respective aperture, is resiliently urged by said wadded conductor element toward one of said openings and has a contact surface exposed through such one opening; whereby said plurality of conductive contact elements in each of said apertures of said array provides yieldable compressive electrical contact with abutting conductors disposed at each of said openings of said array of apertures for establishing electrical paths through said dielectric housing and between such abutting conductors arranged in various locations at said openings of said dielectric housing.

32. The electrical connector of claim 31 in which said apertures extending through said housing means are in a close packed array.

33. The invention of claim 27 or 31 in which said one additional contact member comprises a plunger contact element having a terminal end configured to effect a point-like contact with a conductor surface engaged thereby.

34. The invention of claim 27 or 31 in which each of said plurality of conductive contact elements includes opposed reciprocable plunger contact elements reciprocably and resiliently outwardly biased by at least one of said wadded conductor contact elements interposed said opposed plunger contact element.

35. The invention of claim 27 or 31 in which at least some of the aperture openings of said dielectric housing are chamfered.

36. The electrical connector of claim 27 or 31 in which said housing means comprises a first housing member in which said wadded conductor contact elements are disposed and a second housing member in which said additional conductor contact elements are disposed; said additional conductor contact elements comprising reciprocally movable plunger members.

37. The invention of claim 27 or 31 and including conductors disposed at one surface of said housing means, wherein said conductors comprise plated through openings which engage said additional contact elements disposed in said apertures of said housing means in electrical engagement.

38. The invention of claim 37 in which said conductors are disposed in a probe card and said additional contact elements comprise plunger contacts having terminal ends for at least partially entering said plated through openings for electrical engagement therewith.

* * * * *

UNITED STATES PATENT AND TRADEMARK OFFICE
CERTIFICATE OF CORRECTION

PATENT NO. : 5,127,837
DATED : July 7, 1992
INVENTOR(S) : Arun J. Shah, et. al.

It is certified that error appears in the above-indentified patent and that said Letters Patent is hereby corrected as shown below:

On the Title page, item [75], Fourth inventor's last name "Linderman" should be --Lindeman--.
On the Title page, item [56], References Cited: U.S. Patent No. 3,795,047, Abolafia et al., delete "3/1973" and substitute therefor --3/1974--.
Column 11, line 30, delete "a" and substitute therefor--said--and in the same line after the word "element" insert the word --being--.
Column 12, line 21, delete "claims" and substitute therefor --claim--.
Column 13, lines 7-10, delete the phrase "said plurality of contact elements comprising a wadded conductor first contact elements disposed in each of said apertures"
Column 14, line 40, delete "10" and substitute therefor --19--.
Column 14, line 48-49, delete "elements" and substitute therefor --element--.
Column 16, line 3, delete "ends" and substitute therefor--end--.
Column 18, line 3, delete "element" and substitute therefor --elements--.

Signed and Sealed this

Twenty-eighth Day of September, 1993

Attest:

BRUCE LEHMAN

*Attesting Officer*    *Commissioner of Patents and Trademarks*